(12) United States Patent
Wen et al.

(10) Patent No.: US 10,312,953 B2
(45) Date of Patent: Jun. 4, 2019

(54) ORTHOGONAL FREQUENCY DIVISION MULTIPLEXING RECEIVER WITH LOW-RESOLUTION ANALOG TO DIGITAL CONVERTER AND ELECTRONIC DEVICE THEREOF

(71) Applicant: Industrial Technology Research Institute, Hsinchu (TW)

(72) Inventors: Chao-Kai Wen, Kaohsiung (TW);
Chang-Jen Wang, New Taipei (TW);
Jing-Shiun Lin, Taichung (TW);
Jen-Yuan Hsu, Kinmen County (TW);
Dung-Rung Hsieh, Hsinchu (TW);
Chiu-Ping Wu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/390,543

(22) Filed: Dec. 26, 2016

(65) Prior Publication Data

US 2018/0183472 A1 Jun. 28, 2018

(51) Int. Cl.
*H04B 7/0417* (2017.01)
*H04B 1/10* (2006.01)
(Continued)

(52) U.S. Cl.
CPC ............ *H04B 1/1027* (2013.01); *H03M 1/06* (2013.01); *H03M 1/0854* (2013.01);
(Continued)

(58) Field of Classification Search
CPC combination set(s) only.
See application file for complete search history.

(56) References Cited

U.S. PATENT DOCUMENTS 8,446,996 B1  5/2013  Viadyanathan et al.
8,514,984 B2 * 8/2013  Tang ........................ H04L 1/005
                                                              375/341
(Continued)

FOREIGN PATENT DOCUMENTS

CN    101478523    6/2012
CN    102783106    4/2015
(Continued)

OTHER PUBLICATIONS

Hanging Wang et al.,"Optimal Data Detection for OFDM System with Low-Resolution Quantization", 2016 IEEE International Conference on Communication Systems(ICCS), Dec. 14-16, 2016, pp. 1-6.
(Continued)

*Primary Examiner* — Linda Wong
(74) *Attorney, Agent, or Firm* — JCIPRNET

(57) ABSTRACT

The disclosure is directed to an OFDM receiver with a low-resolution ADC and an electronic device thereof. According to one of the exemplary embodiments, the OFDM receiver may include not limited to: an ADC module which receives a transmission signal of a channel in an analog format and digitizes the transmission signal into a digital format to generate a quantized transmission signal; an error compensating and estimating module which is coupled to the ADC module, receives the quantized transmission signal and a feedback signal which is a first estimated time-domain transmission signal to generate an estimated error signal according to a turbo iterative updating technique; and a signal estimating module which is coupled to the error compensating and estimating module, receives the estimated error signal and a channel attenuation coefficient of the channel to generate an estimated transmission signal.

18 Claims, 6 Drawing Sheets

(51) Int. Cl.
*H03M 1/06* (2006.01)
*H03M 1/08* (2006.01)
*H04L 1/00* (2006.01)
*H04L 27/26* (2006.01)
*H04L 25/02* (2006.01)
*H03M 1/66* (2006.01)

(52) U.S. Cl.
CPC ......... *H04B 7/0417* (2013.01); *H04L 1/0054* (2013.01); *H04L 25/0256* (2013.01); *H04L 25/0258* (2013.01); *H04L 27/2647* (2013.01); *H03M 1/66* (2013.01)

(56) References Cited

U.S. PATENT DOCUMENTS

| | | | | |
|---|---|---|---|---|
| 8,542,724 | B1* | 9/2013 | Blackmon | H04L 25/03057 375/229 |
| 2005/0018794 | A1* | 1/2005 | Tang | H04L 25/03171 375/341 |
| 2006/0062283 | A1* | 3/2006 | Zhang | H04L 1/005 375/147 |
| 2009/0103666 | A1* | 4/2009 | Zhao | H04L 25/022 375/341 |
| 2009/0290667 | A1* | 11/2009 | McElwain | H03M 13/2957 375/350 |
| 2012/0063532 | A1* | 3/2012 | Yoshimoto | H04J 11/004 375/285 |
| 2012/0134446 | A1 | 5/2012 | Zhou et al. | |
| 2012/0201333 | A1* | 8/2012 | Okamoto | H04L 27/2647 375/340 |
| 2013/0003873 | A1 | 1/2013 | Findlater et al. | |
| 2013/0022097 | A1* | 1/2013 | Hewavithana | H04L 25/022 375/232 |
| 2013/0177095 | A1 | 7/2013 | Sun et al. | |
| 2014/0050286 | A1* | 2/2014 | Dick | H03M 13/258 375/340 |
| 2014/0204991 | A1* | 7/2014 | Huang | H03M 13/2957 375/232 |
| 2015/0003380 | A1* | 1/2015 | Ling | H04B 7/0805 370/329 |
| 2015/0131758 | A1* | 5/2015 | Chen | H04B 1/1027 375/340 |
| 2015/0215010 | A1* | 7/2015 | Shim | H04B 7/0413 375/341 |
| 2016/0065315 | A1* | 3/2016 | Koike-Akino | H04B 10/6165 398/44 |
| 2016/0359646 | A1* | 12/2016 | Iqbal | H04L 25/03159 |
| 2018/0234208 | A1* | 8/2018 | Castelain | H03M 13/1111 |

FOREIGN PATENT DOCUMENTS

| | | |
|---|---|---|
| TW | 201616895 | 5/2016 |
| WO | 2010102829 | 9/2010 |

OTHER PUBLICATIONS

"Search Report of Europe Counterpart Application," dated Aug. 14, 2017, p. 1-p. 7, in which the listed reference was cited.

"Office Action of Taiwan Counterpart Application," dated Jul. 31, 2017, p. 1-p. 10, in which the listed references were cited.

Walt Kester et al., "ADC architectures V: Pipelined subranging ADCs," Tutorial MT-024, Analog Devices, Inc , 2009, pp. 1-14.

Wen et al., "Joint Channel-and-Data Estimation for Large-MIMO Systems with Low-Precision ADCs, " arXiv:1501.05580v1, Jan. 22, 2015, pp. 1-7.

Muta et al., "Effect of Linearity Enhancement in A/D Conversion for Single Carrier Transmission Systems," IEEE 81st Vehicular Technology Conference (VTC Spring), May 11-14, 2015 , pp. 1-5.

Wu et al., "Message-Passing Receiver for Joint Channel Estimation and Decoding in 3D Massive MIMO-OFDM Systems," arXiv:1509.09059v2, Jan. 4, 2016, pp. 1-31.

Studer et al., "Quantized Massive MU-MIMO-OFDM Uplink," arXiv:1509.07928v2, Apr. 20, 2016, pp. 1-13.

Orhan et al., "Low Power Analog-to-Digital Conversion in Millimeter Wave Systems: Impact of Resolution and Bandwidth on Performance," arXiv:1502.01980v1, Feb. 6, 2015, pp. 1-8.

Rusu et al., "Adaptive One-Bit Compressive Sensing with Application to Low-Precision Receivers at mmWave," IEEE Global Communications Conference (GLOBECOM), Dec. 6-10, 2015, pp. 1-6.

Fan et al., "Uplink Achievable Rate for Massive MIMO Systems With Low-Resolution ADC," IEEE Communications Letters, Dec. 2015, pp. 2186-2189.

* cited by examiner

ORTHOGONAL FREQUENCY DIVISION MULTIPLEXING RECEIVER WITH LOW-RESOLUTION ANALOG TO DIGITAL CONVERTER AND ELECTRONIC DEVICE THEREOF

TECHNICAL FIELD

The disclosure is directed to an orthogonal frequency division multiplexing (OFDM) receiver with a low-resolution analog to digital converter (ADC) and an electronic device thereof.

BACKGROUND

As the communication technology is gravitating toward the millimeter wave (mmWave) technology, beam forming and multi-input multi-output (MIMO) technology will be featured in the upcoming 5G communication system for which a greater number of mobile devices as well as an explosive growth of the amount of data transmission will be anticipated. In order to solve the problem of frequency selective fading in MIMO systems, researchers have tried to using orthogonal frequency division multiplexing (OFDM). Meanwhile, the technological upgrade into 5G will bring about an increase of the system bandwidth, an increase of antenna operational frequency, an increase of the number of antennas, and so forth. The increase of the system bandwidth will bring about an increase of sampling frequency.

Although an antenna would transmit and receive signals in the radio frequency (RF) or mmWave frequency, the signals would need to be converted into digital signals in order to be used by a modern digital communication system. In order to convert between the analog domain and the digital domain, an analog-to-digital converter (ADC) has been used to convert from an analog signal format into a digital signal format. Similarly, a digital-to-analog converter (DAC) is used to convert from a digital signal format to an analog signal format.

Under a high sampling frequency, the design of the ADC and DAC would be quite challenging. Also, since MIMO would demand a large quantity of antennas, the number of ADCs/DACs to be used will also increase as one antenna would typically require one ADC or DAC. However, the increased number of ADC or DAC will bring about problems in the future when the 5G communication system is implemented. For example, in order for a receiver to deduce the impact of quantization error, a high resolution ADC (HADC). If a high number of HADCs is used in the 5G communication system in conjunction with the expected high transmission bandwidth, the sampling frequency of the HADC will be quite high. This would mean that the power consumption of the HADC will be high, and thus the battery of a mobile phone could be drained more quickly. Also, the increase number of HADCs would mean that the cost of a communication apparatus would be quite high as the number of HADC would need to proportionally match the number of MIMO antennas and thus would increase the overall cost of a receiver.

FIG. 1A is a line graph which illustrates the throughput versus power consumption of various commercial ADCs. It could be deduced from FIG. 1A that with the number of bits being equal, the increase of power consumption would be nearly proportional to the increase of sampling frequency. FIG. 1B is a line graph which illustrates the resolution versus power consumption of various commercial ADCs. It could be deduced from FIG. 1B shows that with the sampling speed being equal, the cost of HADC would increase with the sampling frequency. Also in a typical communication system, the resolution of an ADC is an important factor that affects the overall system performance as an ADC could be a resource of unfavorable noise figures (NF). FIG. 1C shows the bit error rate versus SNR between a high resolution channel and a low-resolution channel. FIG. 1C would show that an ADC could be a source of quantization error.

In the foreseeable future, a 5G communication system would need to process a very large frequency width and thus the sampling rate of ADCs will be quite high. As the sampling frequency becomes higher, the power of the ADCs will increase. In order to compensate for the transmission path loss of an mmWave communication system, the use of large antenna array cause a large number of ADCs to be required. However, it is nearly impossible currently to design an ADC hardware having both a high resolution and a high sampling rate. Even if such design is feasible, the ADC will be quite cost prohibitive.

FIG. 1D illustrates a SNR budget diagram of a hypothetical ADC. In general, an ADC in a RF/mmWave receiver would need to meet a specific SNR budget in order for the overall communication system to achieve a reasonable system performance. Although a high resolution ADC (HADC) could be used to achieve a reasonable system performance, the overall cost and power consumption as the result of the increase of the number of antennas would render the proliferation of HADCs unfeasible. Currently there is hardly any solution that uses low-resolution ADCs to achieve the same system performance as HADCs.

SUMMARY OF THE DISCLOSURE

Accordingly, the disclosure is directed to an orthogonal frequency division multiplexing (OFDM) receiver with a low-resolution analog to digital converter (ADC) and an electronic device thereof.

According to one of the exemplary embodiments, the disclosure is directed to an orthogonal frequency division multiplexing (OFDM) receiver which includes not limited to: an ADC module which receives a transmission signal of a channel in an analog format and digitizes the transmission signal into a digital format to generate a quantized transmission signal; an error compensating and estimating module which is coupled to the ADC module, receives the quantized transmission signal and a feedback signal which is a first estimated time-domain transmission signal to generate an estimated error signal according to a turbo iterative updating technique; and a signal estimating module which is coupled to the error compensating and estimating module, receives the estimated error signal and a channel attenuation coefficient of the channel to generate an estimated transmission signal.

According to one of the exemplary embodiment, the disclosure is directed to an electronic device which includes not limited to: a processor, and an OFDM receiver which includes not limited to: an ADC module which receives a transmission signal of a channel in an analog format and digitizes the transmission signal into a digital format to generate a quantized transmission signal; an error compensating and estimating module which is coupled to the ADC module, receives the quantized transmission signal and a feedback signal which is a first estimated time-domain transmission signal to generate an estimated error signal according to a turbo iterative updating technique; and a signal estimating module which is coupled to the error compensating and estimating module, receives the estimated error signal and a channel attenuation coefficient of the channel to generate an estimated transmission signal.

In order to make the aforementioned features and advantages of the disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the disclosure and is therefore not meant to be limiting or restrictive in any manner. Also the disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1A:
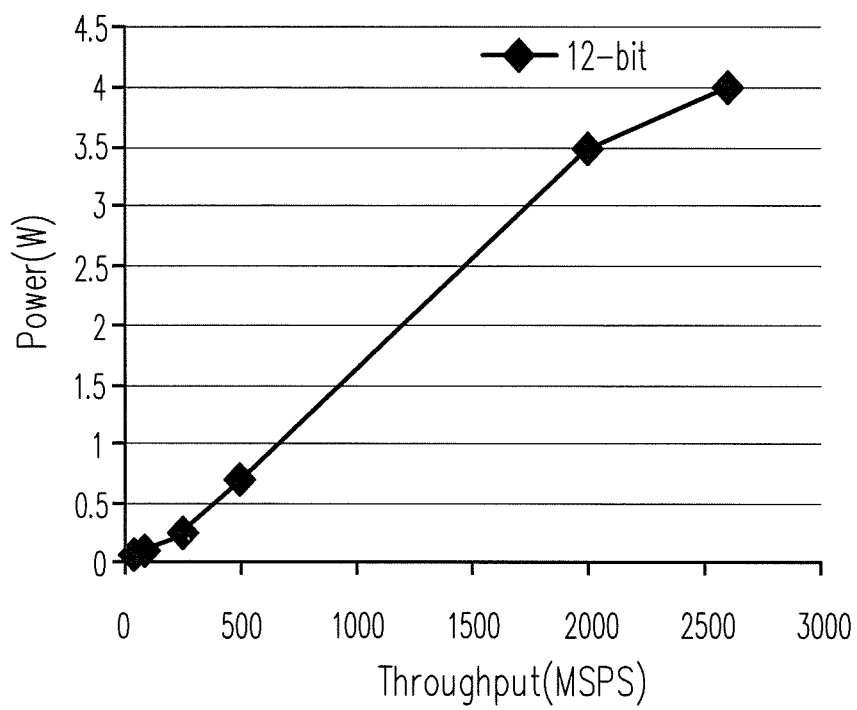
FIG. 1A is a line graph which illustrates the throughput versus power consumption of various commercial ADCs.
Figure 1B:
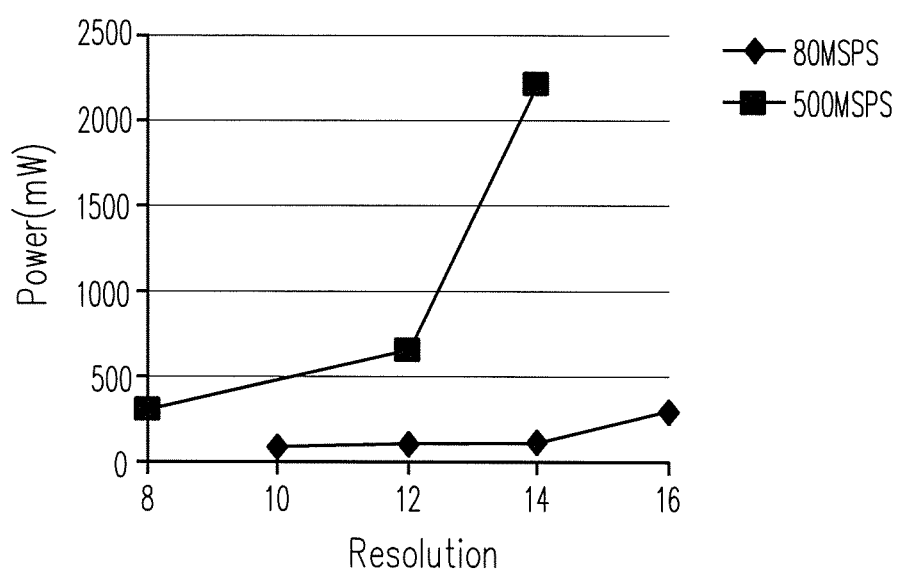
FIG. 1B is a line graph which illustrates the resolution versus power consumption of various commercial ADCs.
Figure 1C:
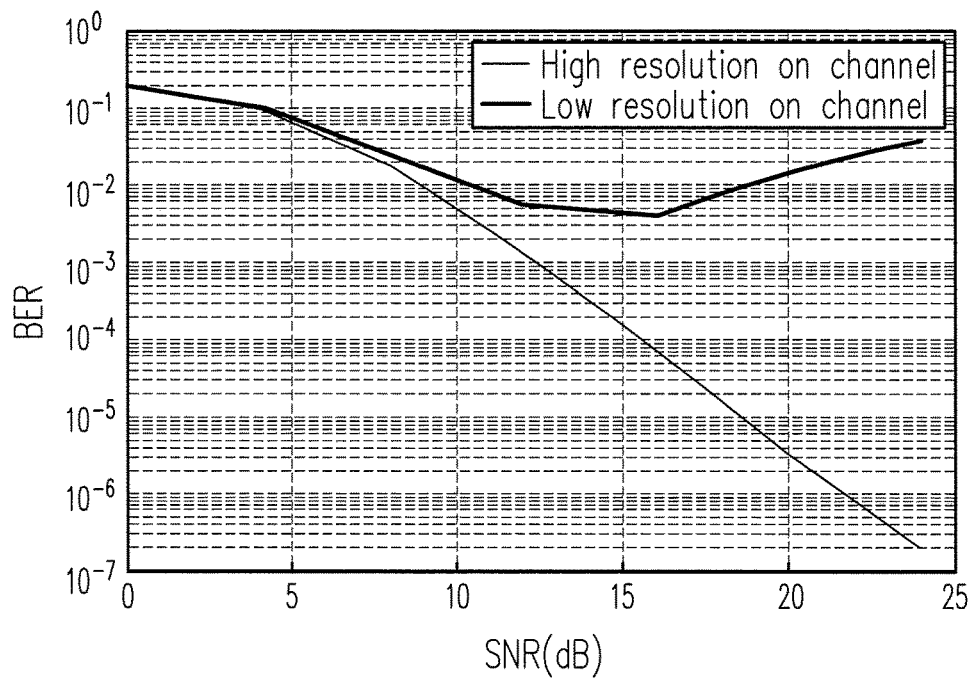
FIG. 1C shows the bit error rate versus SNR between a high resolution channel and a low-resolution channel.
Figure 1D:
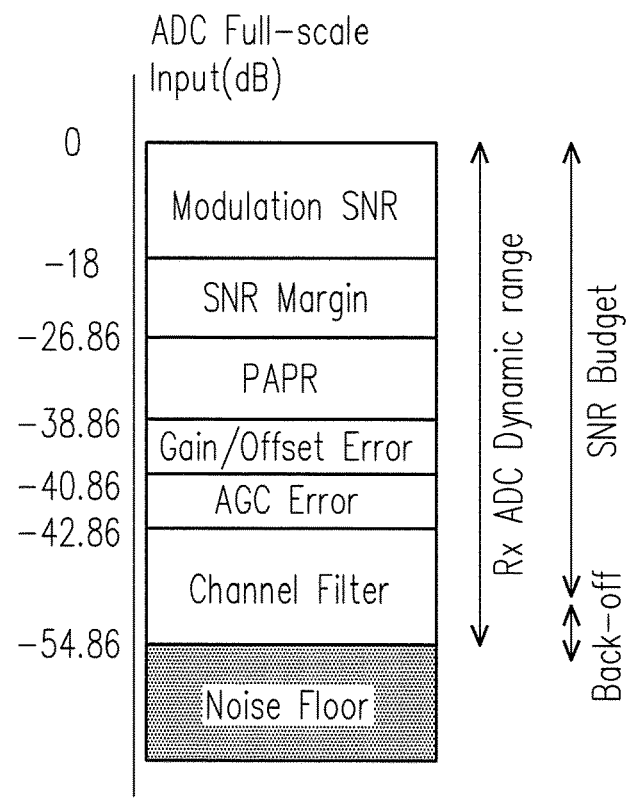
FIG. 1D illustrates a SNR budget diagram of a hypothetical ADC.

Reference will now be made in detail to the present exemplary embodiments of the disclosure, examples of which are illustrated in the accompanying drawings. Wherever possible, the same reference numbers are used in the drawings and the description to refer to the same or like parts.

In recent years, the number of mobile communication users and the amount of data transmission have shown explosive growths. In order to meet the future needs of a high number of transmissions and high transmission rate, the 5G communication system has adapted a MIMO based communication system. For the purpose of avoiding quantization errors, most conventional receivers would use high resolution ADCs. However, as the wireless transmission bandwidth is increased, and the sampling frequency of the ADC would also be increased. This means that the power consumption of the ADC would also proportionally increase. The increased number of antennas increased and the proliferation of high-resolution ADCs (HADCs) would cause the receiver to be cost prohibitive.

The disclosure proposes a low cost OFDM receiver that may use a low-resolution ADC at a very high sampling rate. At this point in time, an ADC may typically have 8~10 bits of resolution and may even contain up to 12 bits or more. For the proposed OFDM receiver, the resolution of the low-resolution ADC may only be around 5 or 6 bits. Conventionally, using a low-resolution ADC would cause the performance of an OFDM based system to degrade significantly. However, using a low-resolution ADC would significantly reduce the cost as well as power consumption in exchange for the loss of performance. Compensation techniques must be implemented to eliminate quantization errors caused by low-resolution ADCs in order to achieve ADC performance that is comparable to a high-resolution ADC. A low-resolution ADC to be used in the 5G communication system would have been impossible because when the received signal is quantized by the low-resolution ADC, a large number of Inter-Carrier Interference (ICI) would be resulted as the orthogonality of the direct carrier of the original OFDM system is destroyed. By utilizing the concept of turbo information exchange and by reconstructing a low-resolution ADC quantization of interference, the disclosed OFDM receiver would be able to accurately estimate the transmission of information so as to enhance the overall performance of the OFDM receiver. By quantifying and estimating the original interference, the interference effect caused by the ICI could be removed. The number of turbo-message exchanges could be dynamically adjusted by an iterative stopping mechanism.

Figure 2:
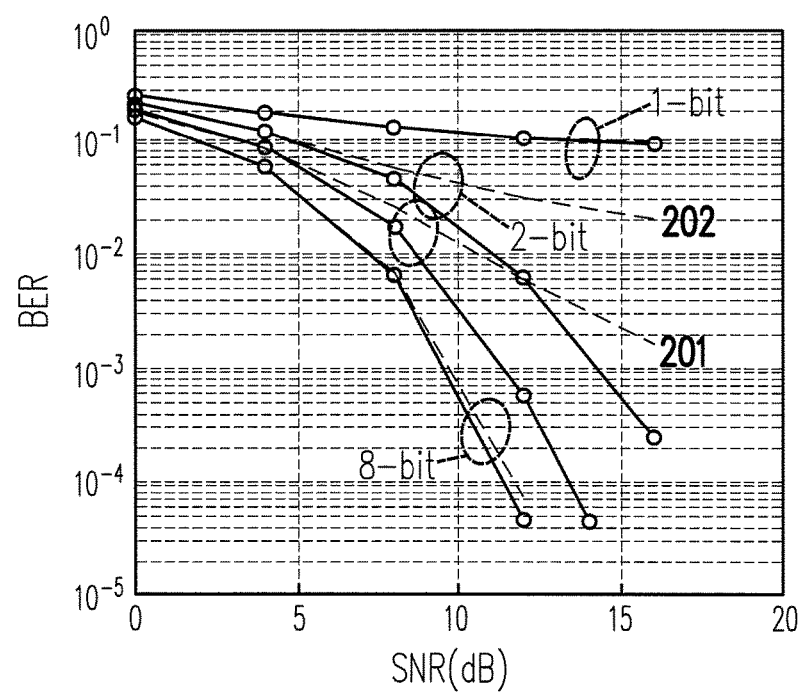
FIG. 2 illustrates results of using an exemplary embodiment of the disclosed OFDM receiver with low-resolution analog to digital converter.

The performance results of the disclosed OFDM receiver with low-resolution ADC are shown FIG. 2 where the first set of plots 201 show the result of compensation through quantization and the second set of plots 202 show the result without any compensation. In addition to being applicable to the future 5G communication system, the disclosure would also reduce the requirement of ADCs of the communication system and thus effectively reduce the installation cost of the system but at the same time maintaining an acceptable system performance.

Figure 3A:
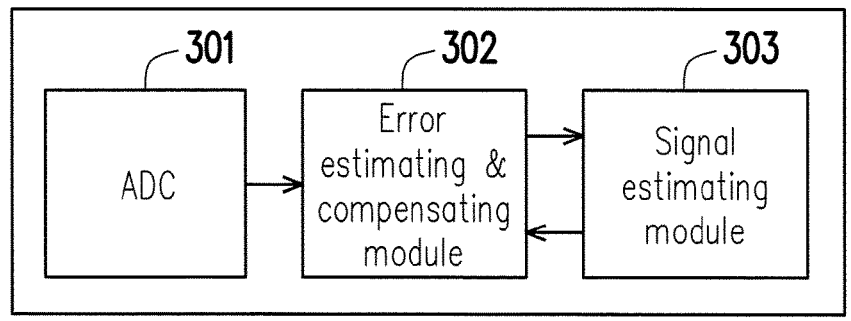
FIG. 3A illustrates a structure of the disclosed OFDM receiver in terms of functional blocks in accordance with one of the exemplary embodiments of the disclosure.

FIG. 3A illustrates a structure of the disclosed OFDM receiver in terms of functional blocks in accordance with one of the exemplary embodiments of the disclosure. The disclosure proposes a low-resolution receiver architecture for an OFDM system which would include not limited to a low-resolution ADC 301, an error compensating and estimating module 302, and a signal estimating module 303. The low-resolution ADC 301 would receive a baseband signal in the analog format and converts the baseband signal into the digital format. The error compensating and estimating module 302 would receive the output from the low-resolution ADC 301 and implement a turbo message exchange to compensate for the quantized interference caused by the low-resolution ADC 301 so as to negate the need of the receive for a high resolution ADC. The error compensating and estimating module 302 would also generate signal related statistical properties. The signal estimating module 303 would receive the output of the error compensating and estimating module 302 and implement a subcarrier signal estimation based on the signal related statistical properties. The output of the subcarrier signal estimation could be fed back to the error compensating and estimating module 302 which would then utilize a turbo recursive approach to improve the performance of the estimation of the subcarrier signal estimation. The number of iteration for implementing the turbo message exchange could be determined by using an iteration stopping mechanism so as to decrease the latency caused by unnecessary calculations. The detailed principle of operation will further be elucidated by FIG. 4~FIG. 6 and their corresponding written descriptions.

Figure 3B:
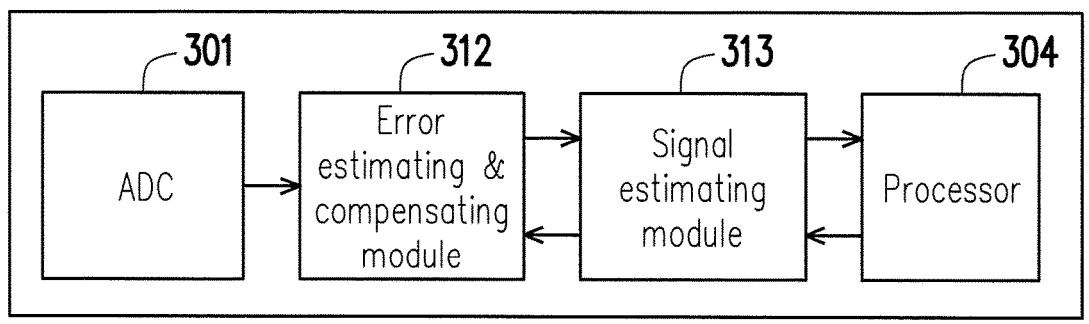
FIG. 3B illustrates the hardware of the disclosed OFDM receiver in terms of functional blocks in accordance with one of the exemplary embodiments of the disclosure.

FIG. 3B illustrates the hardware of the disclosed OFDM receiver in terms of functional blocks in accordance with one of the exemplary embodiments of the disclosure. For this exemplary embodiment, the error compensating and estimating processor 312 is essentially a standalone error compensating and estimating module 302 implemented by using a processor. The signal estimating processor 313 is essentially the standalone signal estimation module 303 implemented by using a processor. The output of the signal estimating processor 313 could be connected to a central processor of the receiver 304 for subsequent digital processing. One or both of the error compensating and estimating processor 312 and signal estimating processor 313 may also be implemented as individual integrated circuits (IC).

Figure 3C:
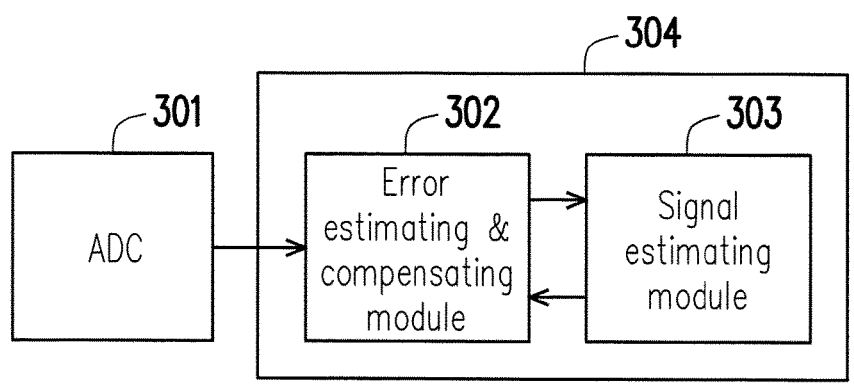
FIG. 3C illustrates the hardware of the disclosed OFDM receiver in terms of functional blocks in accordance with an alternative exemplary embodiment of the disclosure.

FIG. 3C illustrates the hardware of the disclosed OFDM receiver in terms of functional blocks in accordance with an alternative exemplary embodiment of the disclosure. For this exemplary embodiment, the functions of the error compensating and estimating module 302 and the signal estimation module 303 are implemented by a central processor 304 of the receiver. Alternatively, one of the error compensating and estimating module 302 and the signal estimation module 303 could be a standalone unit implemented as an IC or by a processor while the functions of the other are implemented by the central processor 304 of the OFDM receiver.

Figure 4:
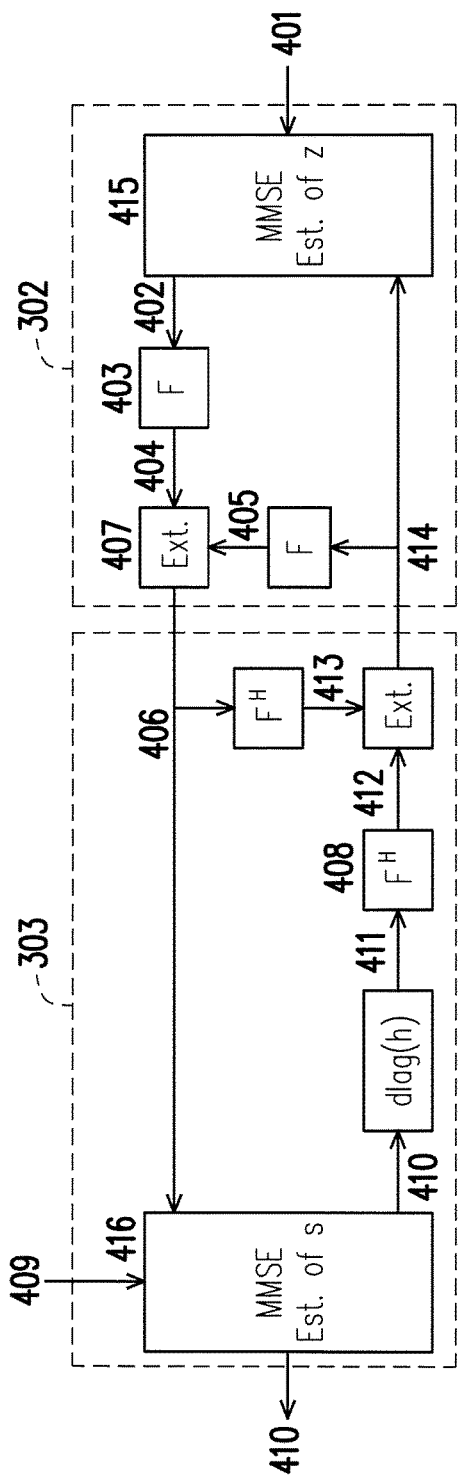
FIG. 4 illustrates partial contents of the disclosed OFDM receiver in further detail in accordance with a first exemplary embodiment of the disclosure.

FIG. 4 illustrates partial contents of the disclosed OFDM receiver in further detail in accordance with a first exemplary embodiment of the disclosure. For this exemplary embodiment, it is assumed that the input signal of the error compensating and estimating module 302 is q 401 which is a digital signal vector that has been converted from a baseband analog signal by the low-resolution ADC 301. It is also assumed that the cyclic prefix has been removed from the input signal, q 401. The input signal q 401 could be expressed as:

$$q=Q(F^H \mathrm{diag}(h)s+n)=Q(F^H x+n)=Q(z+n)$$

where s is the transmission signal which is the analog baseband signal input into the ADC 301, Q(.) is the quantization operation, z is a time-domain transmission signal after the transmission signal has been attenuated by the transmission channel, x is the frequency domain transmission signal after the transmission signal has been attenuated by the transmission channel, and n is the noise of the channel.

The partial contents of the disclosed OFDM receiver would include the error compensating and estimating module 302 which is for reconstructing the statistical properties of signal z and signal x and the signal estimation module 303 for reconstructing the statistical properties of signal z and signal s. The input q 401 is to be processed by the error compensating and estimating module 302, and the input q 401 would contain quantization error resulted from the analog to digital conversion by the low-resolution ADC 301. The input signal q 401 would be received by the z-estimator 415 which performs a minimum mean square error (MMSE) calculation upon the input signal q 401 to generate $z_A^{post}$ 402 which is a first reconstructed time-domain transmission signal after the transmission signal has been attenuated by the transmission channel. Next, a Fast Fourier Transform (FFT) module 403 would perform a FFT upon $z_A^{post}$ 402 to generate $x_A^{post}$ 404 which is a first reconstructed frequency-domain transmission signal after the transmission signal has been attenuated by the transmission channel. Next, an extrinsic information removal module (Ext) 407 would receive $x_A^{post}$ 404 and $x_A^{pri}$ 405 to remove estimated statistical properties by removing $x_A^{pri}$ 405 from $x_A^{post}$ 404 to generate a signal estimation module 303 input, $x_B^{pri}$ 406, which is $x_A^{post}$ 404 without $x_A^{pri}$ 405. The output of Ext 407 would essentially be an estimated error signal. The error compensating and estimating module 302 would receive $z_A^{pri}$ 414 which is a feedback signal from the signal estimation module 303. $z_A^{pri}$ 414 is a first estimated time-domain transmission signal after the transmission signal has been attenuated by the transmission channel. The FFT module 405 would receive $z_A^{pri}$ 414 and generate $x_A^{pri}$ 405 which is a first estimated frequency domain transmission signal after the transmission signal has been attenuated by the transmission channel.

The input of the signal estimation module 303, $x_B^{pri}$ 406, is a second estimated frequency-domain transmission signal after the transmission signal has been attenuated by the transmission channel. The s-estimator 416 of the signal estimation module 303 would receive h 409 which is a channel attenuation coefficient and $x_B^{pri}$ 406 to obtain a reconstructed transmission signal by performing another set of MMSE to generate $s_B^{post}$ 410 which is reconstructed transmission signal. The $s_B^{post}$ 410 would be the output of the signal estimation module 303 and an estimation of s which is the input analog signal to the ADC 301. Next, a product between the diagonal matrix of the channel attenuation coefficient h 409 and the $s_B^{post}$ 410 would generate $x_B^{post}$ 411 which is a second reconstructed frequency-domain transmission signal after the transmission signal has been attenuated by the transmission channel. The inverse FFT module 408 would receive $x_B^{post}$ 411 and perform an inverse FFT to generate $z_B^{post}$ 412 which is a second reconstructed time-domain transmission signal after the transmission signal has been attenuated by the transmission channel. The extrinsic information removal module (Ext) 413 would receive $z_B^{post}$ 412 and $z_B^{pri}$ 413 to remove estimated statistical properties by removing $z_B^{pri}$ 413 from $z_B^{post}$ 412 to generate a feedback signal $z_A^{pri}$ 414 of the signal estimation module 303 input which is $z_B^{post}$ 412 without $z_B^{pri}$ 413. The $z_B^{pri}$ 413 could be obtained by performing an inverse FFT calculation of $x_B^{pri}$ 406. By using the feedback signal $z_A^{pri}$ 414 of the signal estimation module 303 output to estimate the transmission signal s through the channel attenuation of the time domain signal, more accurate information could be leverage to estimation a compensation for the quantization error. This process may repeat for several iterations.

Figure 5:
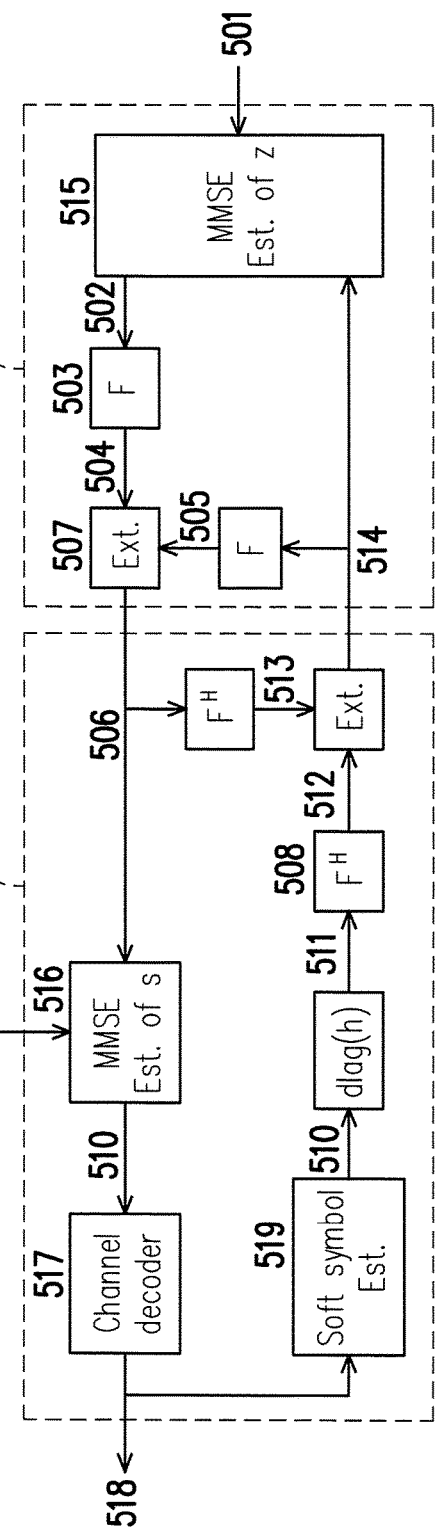
FIG. 5 illustrates partial contents of the disclosed OFDM receiver in further detail in accordance with a second exemplary embodiment of the disclosure.

FIG. 5 illustrates partial contents of the disclosed OFDM receiver in further detail in accordance with a second exemplary embodiment of the disclosure. This exemplary embodiment is similar to the exemplary embodiment of FIG. 4 except that the signal estimating module 303 of FIG. 5 would be different from the signal estimating module 303 of FIG. 4. The signal estimating module 303 of FIG. 5 would utilize a channel decoder to perform error correction so as to more accurately estimated symbol. The output of the channel decoder would be an estimated transmission signal, s, which is used to generate a reconstructed transmission signal after the transmission signal has been attenuated by the transmission channel.

Similar to the exemplary of FIG. 4, for this exemplary embodiment, it is assumed that the input signal of the error compensating and estimating module 302 is q 501 which is a digital signal that has been converted from a baseband analog signal by the low-resolution ADC 301. It is also assumed that the cyclic prefix has been removed from the input signal, q 501. The input signal q 501 could be expressed as:

$$q=Q(F^H\text{diag}(h)s+n)=Q(F^Hx+n)=Q(z+n)$$

where s is the transmission signal which is the analog baseband signal input into the ADC 301, Q(.) is the quantization operation, z is a time-domain transmission signal after the transmission signal has been attenuated by the transmission channel, x is the frequency domain transmission signal after the transmission signal has been attenuated by the transmission channel, and n is the noise of the channel.

The partial contents of the disclosed OFDM receiver would include the error compensating and estimating module 302 which is for reconstructing the statistical properties of signal z and signal x and the signal estimation module 303 for reconstructing the statistical properties of signal z and signal s. The input q 501 is to be processed by the error compensating and estimating module 302, and the input q 501 would contain quantization error resulted from the analog to digital conversion by the low-resolution ADC 301. The input signal q 501 would be received by the z-estimator 515 which performs a minimum mean square error (MMSE) calculation upon the input signal q 501 to generate $z_A^{post}$ 502 which is a first reconstructed time-domain transmission signal after the transmission signal has been attenuated by the transmission channel. Next, a Fast Fourier Transform (FFT) module 503 would perform a FFT upon $z_A^{post}$ 502 to generate $x_A^{post}$ 504 which is a first reconstructed frequency-domain transmission signal after the transmission signal has been attenuated by the transmission channel. Next, an extrinsic information removal module (Ext) 507 would receive $x_A^{post}$ 504 and $x_A^{pri}$ 505 to remove estimated statistical properties by removing $x_A^{pri}$ 505 from $x_A^{post}$ 504 to generate a signal estimation module 303 input, $x_B^{pri}$ 506, which is $x_A^{post}$ 504 without $x_A^{pri}$ 505. The output of Ext 507 would essentially be an estimated error signal. The error compensating and estimating module 302 would receive $z_A^{pri}$ 514 which is a feedback signal from the signal estimation module 303. $z_A^{pri}$ 514 is a first estimated time-domain transmission signal after the transmission signal has been attenuated by the transmission channel. The FFT module 505 would receive $z_A^{pri}$ 514 and generate $x_A^{pri}$ 505 which is a first estimated frequency domain transmission signal after the transmission signal has been attenuated by the transmission channel.

The input of the signal estimation module 303, $x_B^{pri}$ 506, is a second estimated frequency-domain transmission signal after the transmission signal has been attenuated by the transmission channel. The s-estimator 516 of the signal estimation module 303 would receive h 509 which is a channel attenuation coefficient and $x_B^{pri}$ 506 to obtain a reconstructed transmission signal by performing another set of MMSE to generate $s_B^{post}$ 510 which is reconstructed transmission signal. The output of the s-estimator 516, $s_B^{post}$ 510, would be received by a channel decoder 517 which is used to further correct quantization errors and would further minimize noise from the output of the s-estimator. The output of the channel decoder 517 would be the estimated transmission signal or estimated s which is the input analog signal to the ADC 301. Next, the soft symbol estimator 519 would receive the output of the channel decoder 517 to generate $s_B^{post}$ 510. A product between diagonal matrix of the channel attenuation coefficient h 509 and the $s_B^{post}$ 510 would generate $x_B^{post}$ 511 which is a second reconstructed frequency-domain transmission signal after the transmission signal has been attenuated by the transmission channel. The inverse FFT module 508 would receive $x_B^{post}$ 511 and perform an inverse FFT to generate $z_B^{post}$ 512 which is a second reconstructed time-domain transmission signal after the transmission signal has been attenuated by the transmission channel. The extrinsic information removal module (Ext) 513 would receive $z_B^{post}$ 512 and $z_B^{pri}$ 513 to remove estimated statistical properties by removing $z_B^{pri}$ 513 from $z_B^{pri}$ 512 to generate a feedback signal $z_A^{pri}$ 514 of the signal estimation module 303 input which is $z_B^{post}$ 512 without $z_B^{pri}$ 513. The $z_B^{pri}$ 513 could be obtained by performing an inverse FFT calculation of $x_B^{pri}$ 506. By using the feedback signal $z_A^{pri}$ 514 of the signal estimation module 303 output to estimate the transmission signal s through the channel attenuation of the time domain signal, more accurate information could be leverage to estimation a compensation for the quantization error. Similar to the exemplary embodiment of FIG. 5, this process may also repeat for several iterations.

Figure 6:
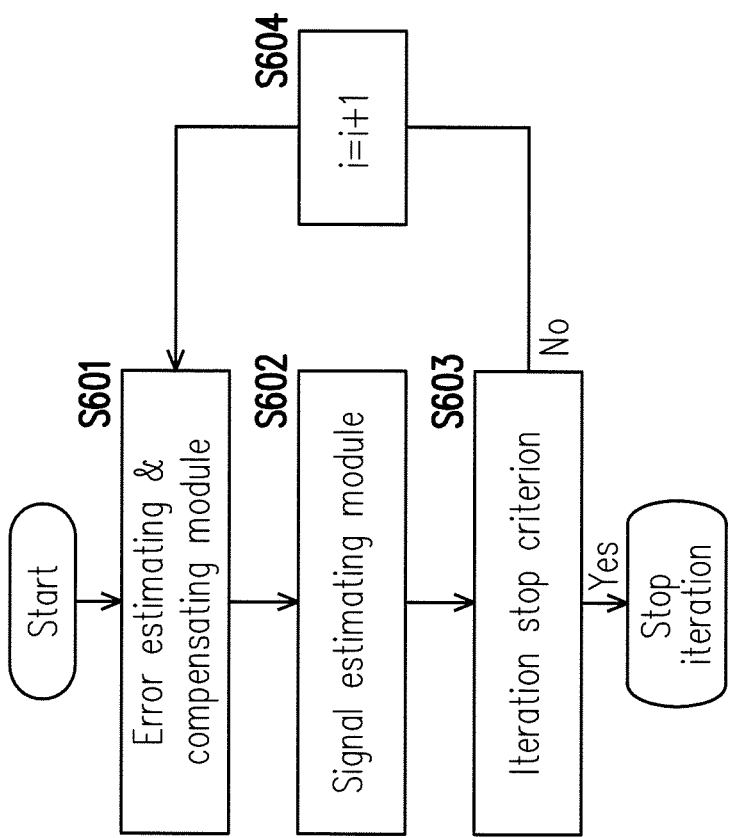
FIG. 6 illustrates an iterative procedure utilized by the disclosed OFDM receiver in accordance with one of the exemplary embodiments of the disclosure.

FIG. 6 illustrates an iterative procedure utilized by the disclosed OFDM receiver in accordance with one of the exemplary embodiments of the disclosure. As shown in FIG. 6, steps S601 and S602 would be executed as the error estimating and compensating module 302 and the signal signaling estimating module 303 would exchange turbo iterations to improve the estimation accuracy of the z-estimator 415 515 and the s-estimator 416 516, respectively. In order to avoid unnecessary data processing caused by multiple iterations, the number of iteration of turbo iterative updating technique could be determined based on whether the number of iterations has exceeded a threshold. Thus, in step S603, if the predefined threshold has been exceeded, the turbo iteration is terminated. Otherwise, in step S604, the turbo iteration is repeated and the counter, i, is incremented by 1 until the set number of iterations is reached.

In addition to determining whether the number of iterations has exceeded a threshold, the calculations of the previous iteration and the iteration information could be used to calculate the probability of result of the calculation changing. For example, the number of iteration of turbo iterative updating technique could be determined based on whether a variation between consecutive results of the estimated transmission signal (e.g. 410, 518) exceeds a predetermined threshold.

In addition, Cyclic Redundancy Check (CRC) can be used to determine whether the calculated estimated transmission signal (e.g. 410, 518) is legitimate. If the calculated estimated transmission signal appear legitimate, then the turbo iteration could be terminated; otherwise, the turbo iteration again may continue until the number of iterations has exceeded the threshold. Therefore, the number of turbo iterations could be determined based on an output of the channel decoder or a result of cyclic redundancy check as more errors from the output of the channel decoder or the result of cyclic redundancy check would increase the number of iteration.

According to one of the exemplary embodiments, the disclosure provides an orthogonal frequency division multiplexing (OFDM) receiver which may include not limited to: an ADC module (301) which receives a transmission signal of a channel in an analog format and digitizes the transmission signal into a digital format to generate a quantized transmission signal (q); an error compensating and estimating module (302) which is coupled to the ADC module (301), receives the quantized transmission signal (q) and a feedback signal 414 which is a first estimated time-domain transmission signal to generate an estimated error signal 406 according to a turbo iterative updating technique; and a signal estimating module (303) which is coupled to the error compensating and estimating module (302), receives the estimated error signal 406 and a channel attenuation coefficient (h) of the channel to generate an estimated transmission signal (410).

According to one of the exemplary embodiments, the error compensating and estimating module 302 may include a z-estimator 415 which receives the quantized transmission signal (q) and generate a first reconstructed time-domain transmission signal 402. The z-estimator may generate the first reconstructed time-domain transmission signal 402 by performing a minimum mean square error (MMSE) calculation of the quantized transmission signal or by performing a zero forcing (ZF) calculation of the quantized transmission signal (q).

According to one of the exemplary embodiments, the error compensating and estimating module 302 generates the estimated error signal 406 at least by: converting the first reconstructed time-domain transmission signal 502 into a first reconstructed frequency-domain transmission signal 504; converting the feedback signal 514 into a first estimated frequency domain transmission signal 505; and generating the estimated error signal 506 based on a difference between the first reconstructed frequency-domain transmission signal 507 and the first estimated frequency domain transmission signal 505.

According to one of the exemplary embodiments, the signal estimating module 303 would include an s-estimator 416 which calculates the estimated transmission signal 410 from the estimated error signal 406 and the channel attenuation coefficient 409 of the channel based on performing a minimum mean square error (MMSE) calculation or a zero forcing (ZF) calculation. Alternatively, the signal estimating module 303 may further include a channel decoder 517 which receives an output of the s-estimator 516 to generate the estimated transmission signal, wherein the channel decoder is one of a Turbo decoder, a LDPC decoder, a RS decoder, and a Viterbi decoder.

According to one of the exemplary embodiments, the signal estimating module 303 generates the feedback signal at least by: performing a diagonal matrix operation of the estimated transmission signal 410 to generate a second reconstructed frequency-domain transmission signal 411; converting the second reconstructed frequency-domain transmission signal 411 into a second reconstructed time-domain transmission signal 412; converting the estimated error signal 406 which is a second estimated frequency-domain transmission signal into a second estimated time-domain transmission signal 413; and generating the feedback signal 514 based on a difference between the second reconstructed frequency-domain transmission signal 512 and the second estimated frequency domain transmission signal 513.

The disclosed OFDM receiver could be disposed within an electronic device according to various configurations not limited to FIG. 3B and FIG. 3C.

In view of the aforementioned descriptions, the present disclosure is suitable for being used in a wireless communication system and is able to be utilized in a low cost OFDM receiver that uses a low-resolution ADC at a very high sampling rate. By utilizing the concept of turbo information exchange and by reconstructing a low-resolution ADC quantization of interference, the disclosed OFDM receiver would be able to accurately estimate the transmission of information so as to enhance the overall performance of the OFDM receiver. By quantifying and estimating the original interference, the interference effect caused by the ICI could be removed. The number of turbo-message exchanges could be dynamically adjusted by an iterative stopping mechanism. The disclosure may also be used to reduce the requirement of ADCs of the communication system and thus effectively reduce the installation cost of the system but at the same time maintaining an acceptable system performance. It should be noted that this disclosure does not require all the aforementioned advantages.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An orthogonal frequency division multiplexing (OFDM) receiver comprising:
   an ADC module which receives a transmission signal of a channel in an analog format and digitizes the transmission signal into a digital format to generate a quantized transmission signal;
   an error compensating and estimating module which is coupled to the ADC module, receives the quantized transmission signal and a feedback signal which is a first estimated time-domain transmission signal to generate an estimated error signal according to a turbo iterative updating technique; and
   a signal estimating module which is coupled to the error compensating and estimating module, receives the estimated error signal and a channel attenuation coefficient of the channel to directly output an estimated transmission signal, wherein the signal estimating module comprising:
   a s-estimator which calculates the estimated transmission signal from the estimated error signal and the channel attenuation coefficient of the channel based on performing a minimum mean square error (MMSE) calculation or a zero forcing (ZF) calculation.

2. The receiver of claim 1, wherein the signal estimating module further comprising:
a channel decoder which receives an output of the s-estimator to generate the estimated transmission signal by subtracting noise from the output of the s-estimator, wherein the channel decoder is one of a Turbo decoder, a LDPC decoder, a RS decoder, and a Viterbi decoder.

3. The receiver of claim 1, wherein the signal estimating module generates the feedback signal at least by:
performing a product between a diagonal matrix operation of the channel attenuation coefficient and the estimated transmission signal to generate a second reconstructed frequency-domain transmission signal;
converting the second reconstructed frequency-domain transmission signal into a second reconstructed time-domain transmission signal;
converting the estimated error signal which is a second estimated frequency-domain transmission signal into a second estimated time-domain transmission signal; and
generating the feedback signal based on a difference between the second reconstructed frequency-domain transmission signal and the second estimated frequency domain transmission signal.

4. The receiver of claim 1, wherein a number of iteration of turbo iterative updating technique is determined based on whether the number of iteration has exceeded a first threshold.

5. The receiver of claim 1, wherein a number of iteration of turbo iterative updating technique is determined based on whether a variation between consecutive results of the estimated transmission signal exceeds a second threshold.

6. The receiver of claim 5, wherein the number of iteration of turbo iterative updating technique is determined based on an output of the channel decoder or a result of cyclic redundancy check as more errors from the output of the channel decoder or the result of cyclic redundancy check would increase the number of iteration.

7. The receiver of claim 1, wherein the error compensating and estimating module further comprises a z-estimator which receives the quantized transmission signal and generate a first reconstructed time-domain transmission signal.

8. The receiver of claim 7, wherein the z-estimator generates the first reconstructed time-domain transmission signal by performing a second minimum mean square error (MMSE) calculation of the quantized transmission signal or by performing a second zero forcing (ZF) calculation of the quantized transmission signal.

9. The receiver of claim 7, wherein the error compensating and estimating module generates the estimated error signal at least by:
converting the first reconstructed time-domain transmission signal into a first reconstructed frequency-domain transmission signal;
converting the feedback signal into a first estimated frequency domain transmission signal; and
generating the estimated error signal based on a difference between the first reconstructed frequency-domain transmission signal and the first estimated frequency domain transmission signal.

10. An electronic device comprising:
a processor; and
an OFDM receiver comprising:
an ADC module which receives a transmission signal of a channel in an analog format and digitizes the transmission signal into a digital format to generate a quantized transmission signal;
an error compensating and estimating module which is coupled to the ADC module, receives the quantized transmission signal and a feedback signal which is a first estimated time-domain transmission signal to generate an estimated error signal according to a turbo iterative updating technique; and
a signal estimating module which is coupled to the error compensating and estimating module, receives the estimated error signal and a channel attenuation coefficient of the channel to directly output an estimated transmission signal, wherein the signal estimating module comprising:
a s-estimator which calculates the estimated transmission signal from the estimated error signal and the channel attenuation coefficient of the channel based on performing a minimum mean square error (MMSE) calculation or a zero forcing (ZF) calculation.

11. The electronic device of claim 10, wherein the signal estimating module further comprising:
a channel decoder which receives an output of the s-estimator to generate the estimated transmission signal by subtracting noise from the output of the s-estimator, wherein the channel decoder is one of a Turbo decoder, a LDPC decoder, a RS decoder, and a Viterbi decoder.

12. The electronic device of claim 10, wherein the signal estimating module generates the feedback signal at least by:
performing a product between a diagonal matrix operation of the channel attenuation coefficient and the estimated transmission signal to generate a second reconstructed frequency-domain transmission signal;
converting the second reconstructed frequency-domain transmission signal into a second reconstructed time-domain transmission signal;
converting the estimated error signal which is a second estimated frequency-domain transmission signal into a second estimated time-domain transmission signal; and
generating the feedback signal based on a difference between the second reconstructed frequency-domain transmission signal and the second estimated frequency domain transmission signal.

13. The electronic device of claim 10, wherein a number of iteration of turbo iterative updating technique is determined based on whether the number of iteration has exceeded a first threshold.

14. The electronic device of claim 10, wherein a number of iteration of turbo iterative updating technique is determined based on whether a variation between consecutive results of the estimated transmission signal exceeds a second threshold.

15. The electronic device of claim 14, wherein the number of iteration of turbo iterative updating technique is determined based on an output of the channel decoder or a result of cyclic redundancy check as more errors from the output of the channel decoder or the result of cyclic redundancy check would increase the number of iteration.

16. The electronic device of claim 10, wherein the error compensating and estimating module further comprises a z-estimator which receives the quantized transmission signal and generate a first reconstructed time-domain transmission signal.

17. The electronic device of claim 16, wherein the z-estimator generates the first reconstructed time-domain transmission signal by performing a second minimum mean square error (MMSE) calculation of the quantized transmission signal or by performing a second zero forcing (ZF) calculation of the quantized transmission signal.

18. The electronic device of claim 16, wherein the error compensating and estimating module generates the estimated error signal at least by:
- converting the first reconstructed time-domain transmission signal into a first reconstructed frequency-domain transmission signal;
- converting the feedback signal into a first estimated frequency domain transmission signal; and
- generating the estimated error signal based on a difference between the first reconstructed frequency-domain transmission signal and the first estimated frequency domain transmission signal.

* * * * *